US007260691B2

(12) United States Patent
Bains

(10) Patent No.: US 7,260,691 B2
(45) Date of Patent: Aug. 21, 2007

(54) APPARATUS AND METHOD FOR INITIALIZATION OF A DOUBLE-SIDED DIMM HAVING AT LEAST ONE PAIR OF MIRRORED PINS

(75) Inventor: Knljit S. Bains, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 468 days.

(21) Appl. No.: 10/881,452

(22) Filed: Jun. 30, 2004

(65) Prior Publication Data

US 2006/0004981 A1 Jan. 5, 2006

(51) Int. Cl.
*G06F 13/00* (2006.01)
(52) U.S. Cl. .................. 711/154; 711/105; 711/202
(58) Field of Classification Search ............. None
See application file for complete search history.

(56) References Cited

U.S. PATENT DOCUMENTS 6,490,188 B2 * 12/2002 Nuxoll et al. ............. 365/63
7,023,719 B1 * 4/2006 Hung et al. ............... 365/63
7,103,826 B2 * 9/2006 Thayer et al. ............ 714/763

* cited by examiner

*Primary Examiner*—Reginald Bragdon
*Assistant Examiner*—Shawn Gu
(74) *Attorney, Agent, or Firm*—Philip A. Pedigo

(57) ABSTRACT

A method and apparatus for initialization of a double-sided memory module having a least one pair of mirrored pins. In one embodiment, the method includes the generation of an opcode to initialize a first side of the memory module according to a first side pin routing. In one embodiment, the opcode is written to a host address selected for the first side of the memory module according to a system host address to memory address mapping. In one embodiment, the opcode is altered if a routing of address pins of the opposed side of the memory module are interchanged with reference to the first side pin routing. Subsequently, a unique host address is selected to produce the altered opcode at the address pins of the opposed side of the memory module according to a defined host address to memory address mapping. Other embodiments are described and claimed.

28 Claims, 8 Drawing Sheets

COMPUTER SYSTEM 100

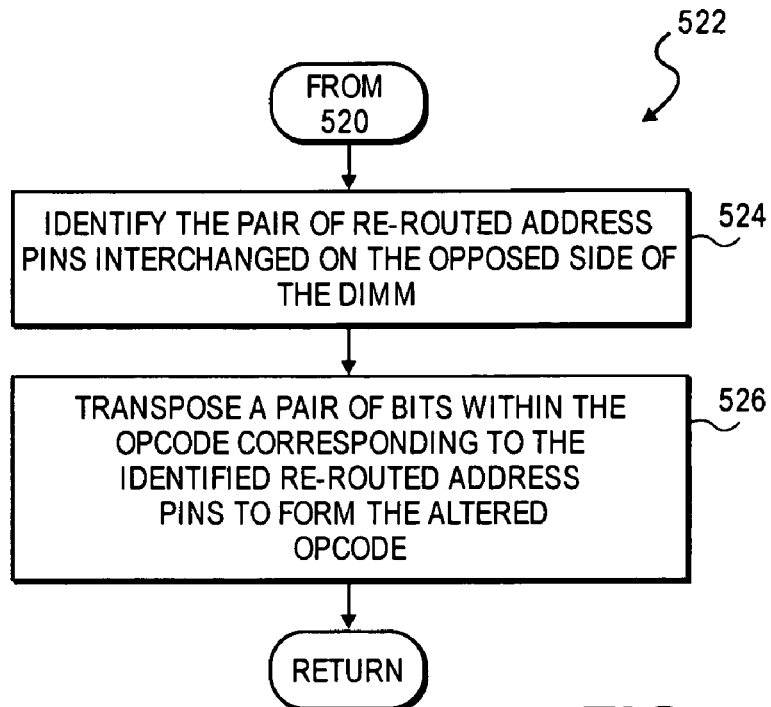

APPARATUS AND METHOD FOR INITIALIZATION OF A DOUBLE-SIDED DIMM HAVING AT LEAST ONE PAIR OF MIRRORED PINS

FIELD OF THE INVENTION

One or more embodiments of the invention relate generally to the field of integrated circuit and computer system design. More particularly, one or more of the embodiments of the invention relates to a method and apparatus for initialization of a double-sided dual in-line memory modules (DIMM) having at least one pair of mirrored pins.

BACKGROUND OF THE INVENTION

Currently, memory packages, such as dual, in-line memory modules (DIMM) may reside on both sides of a printed circuit board (PCB) or other substrate, referred to herein as a double-sided DIMM. This increases memory density for the system. Signals for the memories may route through the substrate, which may have several layers. With memory packages on both sides of the substrate, signal routing and integrity may become an issue.

Signals being routed through the substrate may connect to balls or connections to the DIMM on opposite sides of the packages. For example, signals going to the closest side of the package on the one side of the substrate will generally end up having to go to the farthest side of the package on the other side of the substrate. The DIMM for the other side of the package is turned "upside down" to mount it on the other side, causing the relevant connection to be on the other side of the package from the signal origination.

Furthermore, such DIMM devices may include a double data rate (DDR) memory, such as, a synchronous dynamic random access memory (SDRAM). SDRAM is a volatile and complex memory device; that is, when power is removed from an SDRAM device, all contents and operating configurations are lost. Hence, each time an SDRAM device is powered up, the device requires a defined procedure to initialize the internal state machines and to configure various user-defined operating parameters.

BRIEF DESCRIPTION OF THE DRAWINGS

The various embodiments of the present invention are illustrated by way of example, and not by way of limitation, in the figures of the accompanying drawings and in which:

FIG. 7 is a flowchart illustrating a method for forming an opcode to initialize DINM rank having at least one pair of mirrored pins, in accordance with one embodiment.

FIG. 8 is a flowchart illustrating a method for selecting a unique host address to produce an altered opcode at the address pins of a DIMM rank, in accordance with one embodiment.

DETAILED DESCRIPTION

A method and apparatus for initialization of a double-sided memory module having a least one pair of mirrored pins are described. In one embodiment, the method includes the generation of an opcode to initialize a first side of the memory module according to a first side pin routing of the memory module. In one embodiment, the opcode is written to a host address selected for the first side of the memory module according to a system host address to memory address mapping. In one embodiment, the opcode is altered if a routing of a pair of address pins of the opposed side of the memory module are interchanged with reference to the first side pin routing of the memory module.

In the following description, numerous specific details such as logic implementations, sizes and names of signals and buses, types and interrelationships of system components, and logic partitioning/integration choices are set forth to provide a more thorough understanding. It will be appreciated, however, by one skilled in the art that the invention may be practiced without such specific details. In other instances, control structures and gate level circuits have not been shown in detail to avoid obscuring the invention. Those of ordinary skill in the art, with the included descriptions, will be able to implement appropriate logic circuits without undue experimentation.

In the following description, certain terminology is used to describe features of the invention. For example, the term "logic" is representative of hardware and/or software configured to perform one or more functions. For instance, examples of "hardware" include, but are not limited or restricted to, an integrated circuit, a finite state machine or even combinatorial logical. The integrated circuit may take the form of a processor such as a microprocessor, application specific integrated circuit, a digital signal processor, a microcontroller, or the like.

System

Figure 1:
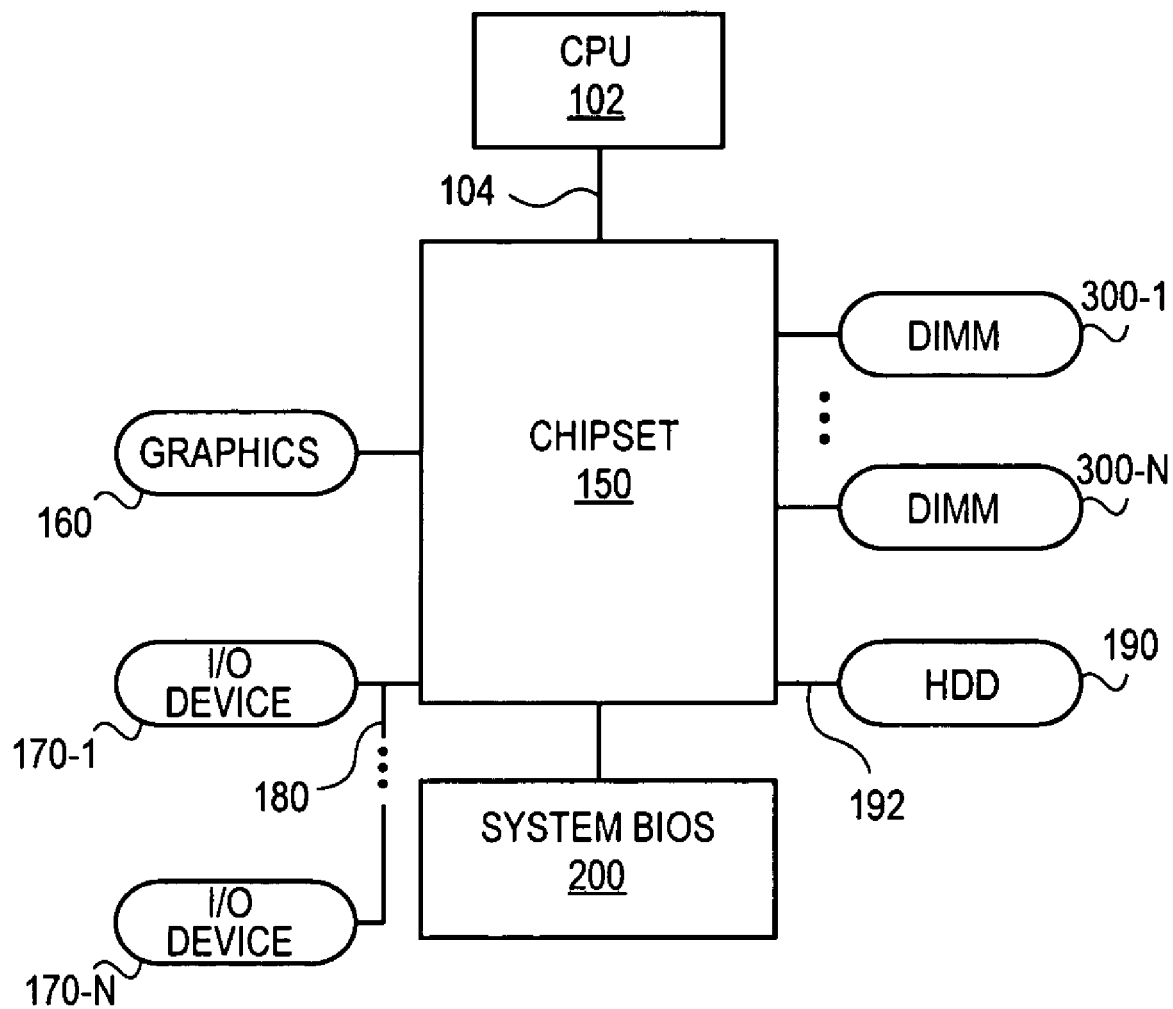
FIG. 1 is a block diagram illustrating a computer system, including a basic input/output (I/O) system to initialize a double-sided memory module having at least one pair of mirrored pins, in accordance with one embodiment.

FIG. 1 is a block diagram illustrating computer system 100 including basic input/output system (BIOS) 200 to initialize double-sided memory module 300 having at least one pair of mirrored pins, in accordance with one embodiment. Representatively, computer system 100 comprises a processor system bus (front side bus (FSB)) 104 for communicating information between processor (CPU) 102 and chipset 110. As described herein, the term "chipset" is used in a manner to collectively describe the various devices coupled to CPU 102 to perform desired system functionality. In one embodiment, chipset functionality, such, as a memory controller is integrated within CPU 102 to enable direction connection between CPU 102 and main memory 300 (300-1, ..., 300-N).

Representatively, chipset 150 may include a memory controller hub (MCH) coupled to graphics controller 160. In an alternative embodiment, graphics controller 160 is integrated into the chipset, such that, in one embodiment, chipset 150 includes an integrated graphics MCH (GMCH). Representatively, chipset 150 is also coupled to main memory 300 (300-1, ..., 300-N). In one embodiment, main memory 300 may include, but is not limited to, a double-sided memory module including memory devices comprised of random access memory (RAM), dynamic RAM (DRAM), static RAM (SRAM), synchronous DRAM (SDRAM), double data rate (DDR) SDRAM (DDR-SDRAM), Rambus DRAM (RDRAM) or any device capable of supporting high-speed storage of data in each memory module device.

In one embodiment, chipset 150 includes an input/output (I/O) controller hub (ICH). Representatively, chipset 150 is coupled to I/O bus 180, such as a universal serial bus (USB) link or interconnect to couple one or more I/O devices 170 to chipset 150. In addition, the I/O devices 170 may include an audio codec (AC). In one embodiment, a serial advance technology attachment (SATA) 192 may couple hard disk drive devices (HDD) 190 to chipset 150. In one embodiment, system BIOS 200 initializes computer system 100 including memory modules 300.

Figure 2:
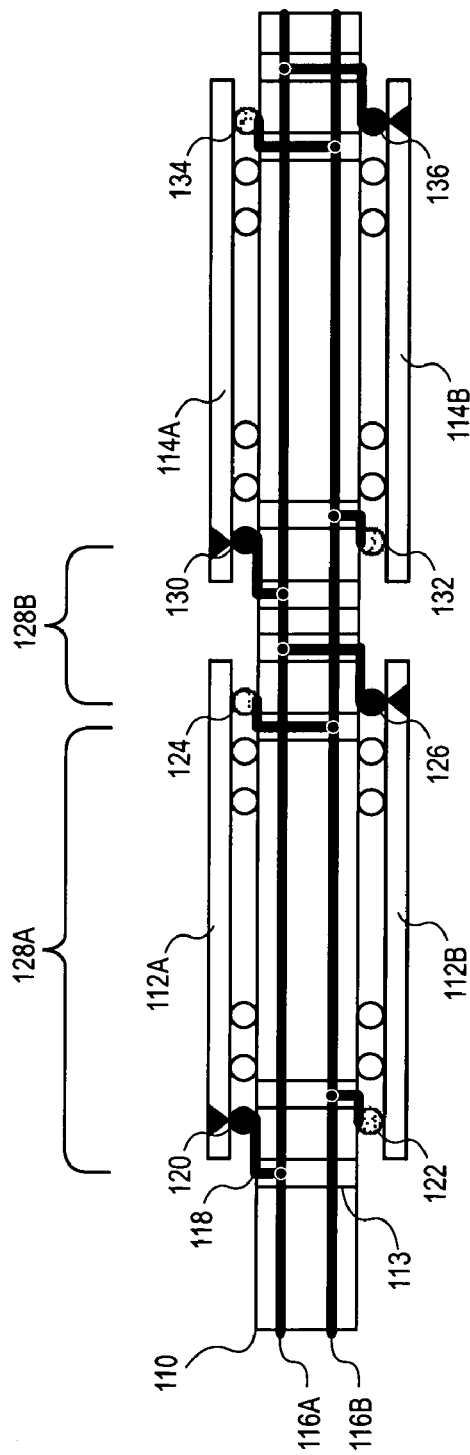
FIG. 2 is a block diagram illustrating a double-sided dual in-line memory module mounting, as known in the art.

FIG. 2 shows a prior art embodiment of a double-sided memory module mounting on a substrate, which could be incorporated within system 100. As described herein, double-sided refers to the fact that the memory devices are mounted on opposite sides of the substrate 110. The substrate 110 may be a multi-layered printed circuit board (PCB), or any other substrate upon which memory modules are mounted. Memory devices 112A and 112B are mounted on opposite sides of substrate 110 from each other, as are memory devices 114A and 114B. Substrate 110 has internally routed signal traces 116A and 116B. Stub 118 through via 113 allows the solder ball or other connection from module 112A to connect to first signal trace 116A.

The via 113 is manufactured on a larger pitch than the signal traces to afford extra width, and the use of several vias can limit the number of traces that can be routed through a single layer of the substrate 110. This may force additional layers and extra costs. In addition, to avoid shorting signals into the internal power and ground plane layers of substrate 110, anti-pads are typically used in the power plane layers, which compromise power delivery to the memories within the modules.

Double-data rate memory (DDR), such as DDR SDRAM, uses both the rising and falling edges of a clock signal to operate the memory, resulting in twice the speed of memories using either the leading or the falling edge of the clock signal. DDR3 is the third version of DDR. In DDR3, as well as other memory types, a command/address bus is a daisy-chained or 'fly-by' bus. This type of bus may have problems with signal integrity due to the unequal routing lengths caused by double-sided memory mounting.

As shown in FIG. 2, signal 116A has a first routing length 128A between the connections 120 and 126. A second routing length 128B is between connection 126 on device 112B and ball 130 on device 114A. The second routing length 128B is far shorter than the first routing length 128A. A similar length difference occurs for signal 116B, with first routing length being from connection 122 to connection 124, and the second routing length being from connection 124 on device 112A to connection 132 on module 114B. It should be noted that connections 120, 122, 124, 126, 130, 132, 134 and 136, are shown here as solder balls, but could be any type of connection used to provide connection between the integrated circuit die and the substrate.

The difference in routing lengths results in non-uniform effective channel impedance. This ultimately ends up lowering the maximum data rate that can be supported by the memory channel, reducing performance. To avoid this routing problem, the prior art has used mirroring within the silicon itself which can redefine a pin to be a different signal without altering the device footprint to allow the routing to look closer to that shown in FIG. 3. The problem with this approach, however, is that logic is required in the data path which also reduces the maximum data rate that can be achieved due to the internal logic delay. Hence, the logic required to implement conventional mirroring introduces latency in the data path, as well as additional overhead into the device manufacture.

Figure 3:
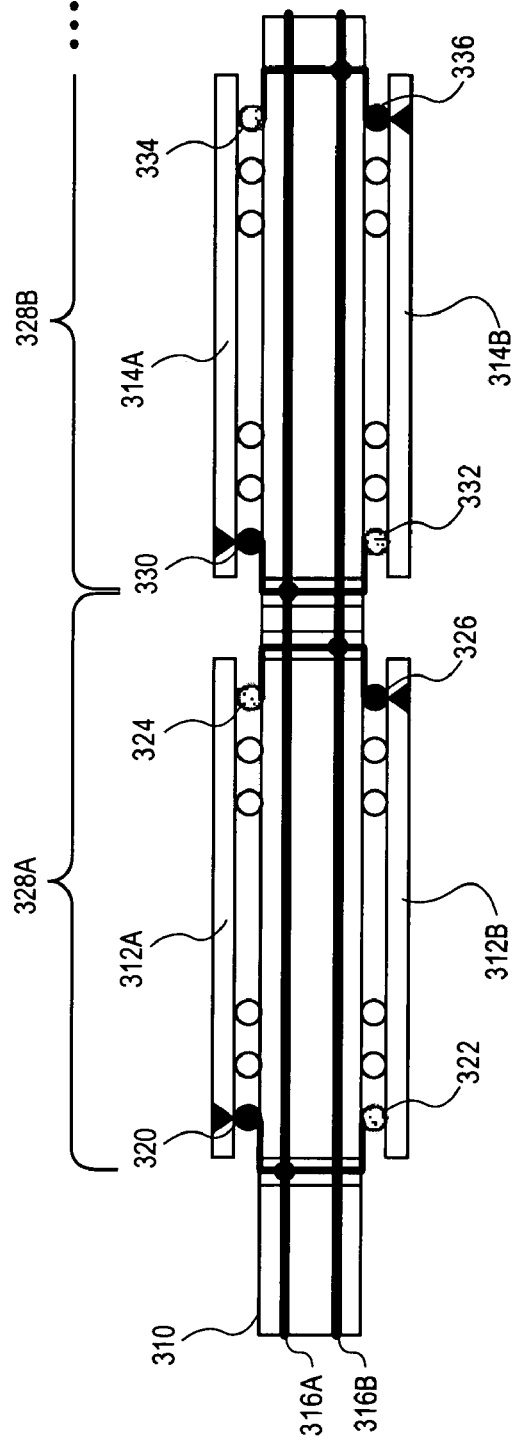
FIG. 3 is a block diagram illustrating a double-sided dual in-line memory module mounting, in accordance with one embodiment.

Accordingly, in one embodiment, the routing of one or more pairs of pins at the memory module level are interchanged to form double-sided memory module 300, as shown in FIG. 3. As illustrated, the routing of pins 322 and 326 of memory device 312B are interchanged with reference to memory device 312A to achieve a new physical interconnectivity for memory device 312B vis-à-vis memory device 312A. Likewise, the routing address pins 332 and 336 of memory device 314B are interchanged with reference to memory module 314A to interchange the physical connectivity for memory module 312B vis-à-vis memory module 312A.

As described herein, the interchange of pin routing at the memory module level to interchange the physical connectivity to memory devices is referred to as "memory module mirroring." In addition, the interchange of the routing of pins 322/332 and 326/336 for memory devices 312B and 314B allows the signals to share vias. Reducing the number of vias eases the restrictions on trace spacing to reduce the number of layers needed in the substrate, thereby reducing costs, as well as mitigating shorts in the power and ground planes.

Hence, as illustrated in FIG. 3, the routing lengths 328A and 328B in this embodiment have become uniform. The term 'uniform' as used here does not mean that they are exactly the same, although that may be the case. Uniformity, as used here, means that the impedances in the signal paths are closely matched to each other between loads. Routing length 328A is now the length from the connection 320 to the connection 330, and routing length 328B is the length from the connection 330 to the connection for the same signal on the next device, not shown. The loads are now more uniformly spaced, which allows the devices to support higher data rates with good signal integrity.

Figure 4:
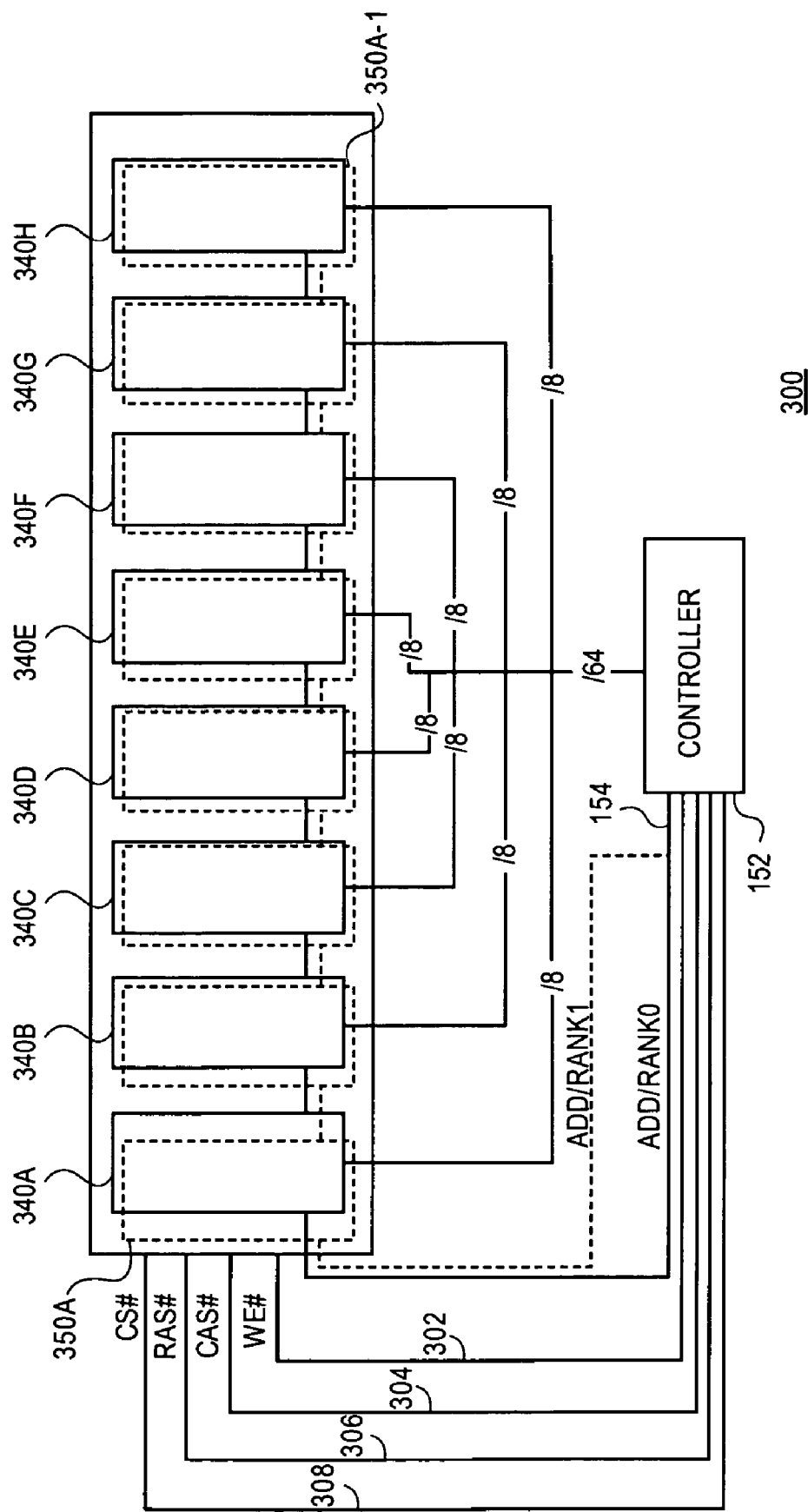
FIG. 4 is a block diagram further illustrating a memory system of FIG. 1, in accordance with one embodiment.

FIG. 4 further illustrates chipset 150 of FIG. 1, including memory controller 152 coupled to double-sided memory module 300, including at least one pair of mirrored pins, in accordance with one embodiment. As shown in FIG. 4, memory controller 152 has a data output of 64 bits (72 bits for error correction code). Each memory device 340A-340H on the substrate 310 is a X8 device; each one can receive 8 bits of data. In addition to the devices 340A-340H on the side facing the viewer, memory devices such as 350A are on the side away from the viewer. Memory devices arranged in such a system are generally addressed using rank-based signals, such as chip select (CS#) signal 308.

In one embodiment, command address (CA) bus 154, which couples controller 152 to address pins of memory module 300, is implemented using a daisy chain topology.

Representatively, there are two ranks (sides) on memory module 300, which require CA bus 154 routing to all address pins of each respective rank on memory module 300. In one embodiment, CA bus 154 is connected to address pin 3 (A3) on the front rank (rank zero) and address pin A9 on the back rank (rank one). Hence, in one embodiment, routing of address pins A3 and A9 are interchanged, using memory module mirroring, as illustrated in FIG. 3. Without mirroring, CA bus 154 would connect to A3 on the back rank, thus resulting in a longer stub length. Hence, by minimizing stub lengths in the daisy chain topology, as illustrated in FIG. 3, scaling CA bus 154 to higher frequencies is possible.

In one embodiment, memory module 300 may include DDR SDRAM memory modules. DDR SDRAM is a volatile and complex memory device; that is, when power is removed from a DDR SDRAM memory module, all contents and operating configurations are lost. In other words, each time the memory is powered up, the device requires a defined procedure to initialize the internal state machine and to configure the various user defined operating parameters. Accordingly, SDRAM's generally have a mode register (not shown) that defines how the device operates. After power-up, the mode register is set to initialize the device.

In one embodiment, initialization of a double-side memory module 300 is performed by system BIOS 200 in conjunction with controller 152. In one embodiment, initialization of each SDRAM within memory module 300 is performed according to a mapping of the address pins of memory module 300 to the mode register 360 of each rank of memory module 300, as illustrated with reference to FIG. 5. Representatively, address pins A0-A15 and bank address (BA) pins BA0-BA2 are used as data input lines to set the mode registers 360 of each rank of memory module devices 300.

Figure 5:
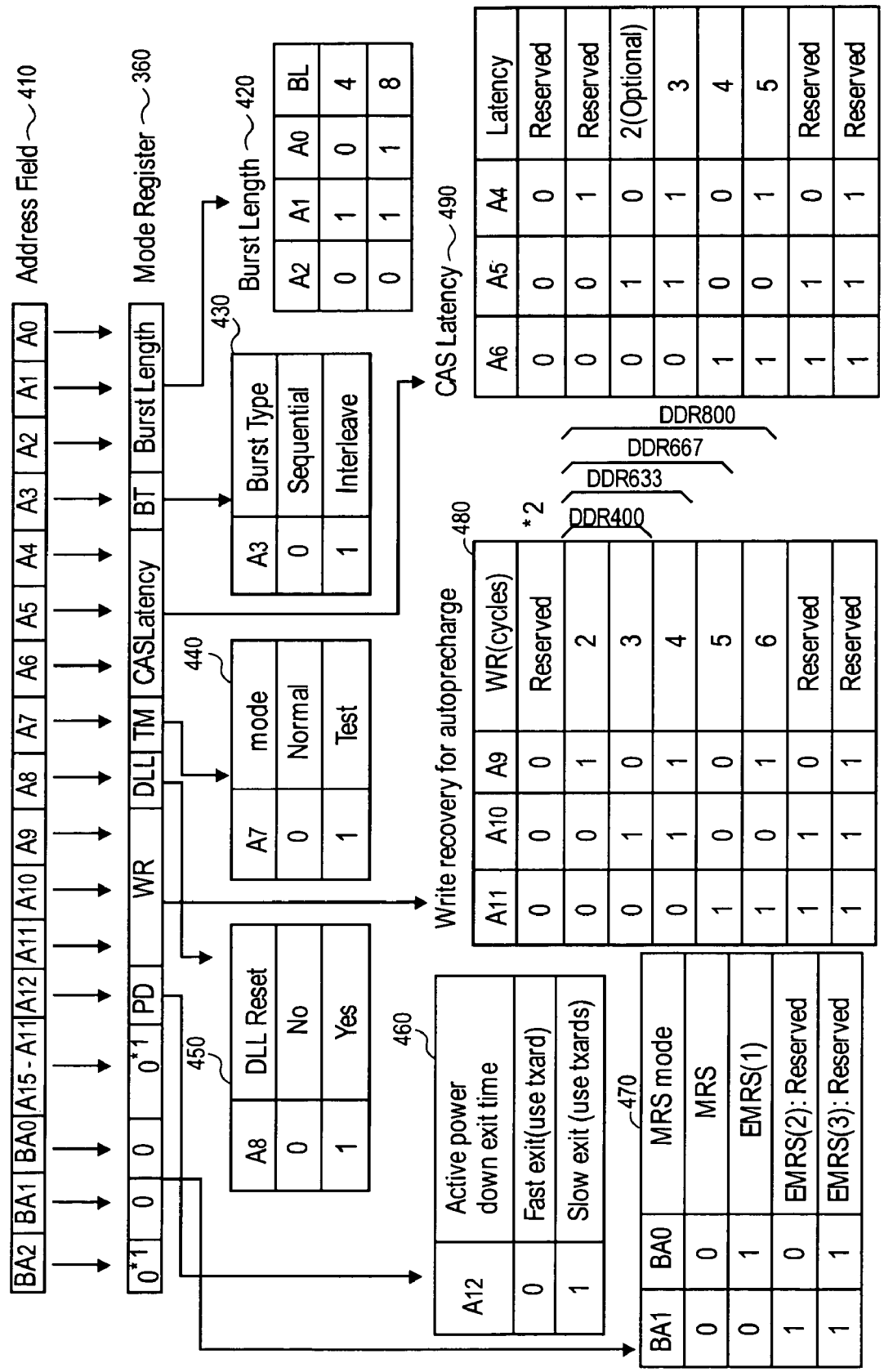
FIG. 5 is a block diagram illustrating an address pin to mode register mapping for DIMM memory module initialization.

In one embodiment, setting of the mode register fields to initialize either rank zero or rank one of memory module 300 is performed by writing an opcode to the address pins of the respective rank according to the mapping illustrated in FIG. 5 for a selected burst length 420, burst type 430, mode 440, DLL reset 450, active powerdown exit time 460, MRS mode 470, write recovery for auto precharge 480, and column address select (CAS) latency 490 for up to four mode registers.

In one embodiment, the opcode generation is performed by system BIOS, such as system BIOS 200, as illustrated in FIG. 1. In one embodiment, the system BIOS may read the contents of, for example, an erasable programmable read only memory (EPROM) to select a desired configuration for each respective rank of dual in-line memory module (DIMM) 300, referred to herein as "DIMM rank zero" and "DIMM rank one." In one embodiment, system BIOS 200 forms an opcode to achieve the desired memory configuration according to a mapping of the address pins of the DIMM rank to the mode register of the DIMM rank, as shown in FIG. 5.

In one embodiment, a unique host address is selected by system BIOS 200 to produce the opcode at the address pins of the respective DIMM rank according to a defined host address to memory address mapping. Referring again to FIG. 1, computer system 100 includes FSB 104, which is configured to perform serial communication. Conversely, command address (CA) bus 154, as illustrated in FIG. 4, is configured according to a multiplexed configuration. Accordingly, chipset 150 maps a physical address received on FSB 104 onto CA bus 154 according to the defined host address to memory address mapping. Hence, in one embodiment, system BIOS 200 is aware of the host address to memory address mapping and hence will select a unique host address that maps to a memory address to produce the desired opcode at the address pins of rank zero or rank one of DIMM 300.

In one embodiment, system BIOS 200 operates in conjunction with chipset 150 to achieve initialization of DIMM devices 300. Accordingly, in one embodiment, system BIOS places a chipset memory controller 152 in a mode where all cycles from CPU 102 to main memory 300 are translated as mode register commands. In one embodiment, controller 152 of FIG. 2 includes a mode register command enable (MRCE) bit. In one embodiment, controller 152 is placed in the desired mode by setting the MRCE bit. Accordingly, once the memory controller is in the desired mode, system BIOS 200 requests a write cycle to the selected, unique host address to cause memory controller 152 to write the opcode to the address pins of the respective DIMM rank.

In one embodiment, once the DIMM rank is provided the required opcode on its address pins, memory controller 152 issues a mode register set (MRS) command to the respective DIMM rank. In one embodiment, the mode register set command is issued to the DIMM by enabling or disabling row address select (RAS#) signal 306, column address select (CAS#) signal 304, write enable (WE#) signal 302 and chip select (CS#) signal 308, as illustrated in FIG. 4. Representatively, CAS#, RAS#, WE# and CS# signals provide a command encoding to issue various commands to the various ranks of DIMM 300. In one embodiment, the encoding for issuing an MRS command is issued to the DIMM rank by driving CAS# signal 304, RAS# signal 306, WE# signal 302 and CS# signal 308 low.

As described herein, signals associated, or appended, with the pound sign (#) represent active low signals or signals that are driven low when asserted. However, as described herein, the terms "assert", "asserting", "asserted", "set", "setting", "deasserted", "deassert", "deasserting" or the like terms may refer to data signals, which are either active low or active high signals. Therefore such terms, when associated with a signal, are interchangeably used to require or imply either active high or active low signals.

Accordingly, once the MRS command is issued to the DIMM rank, the DIMM rank performs its configuration according to the values contained within its mode registers based on the mapping shown in FIG. 5. Accordingly, one embodiment enables memory module mirroring of a command address (CA) bus coupled to each DIMM rank by performing mirroring on a rank-by-rank basis during initialization by mapping host addresses directly to DIMM mode register data contents. Procedural methods for initialization of DIMM devices 300 having at least one pair of mirrored pins are now described.

Operation

Figure 6:
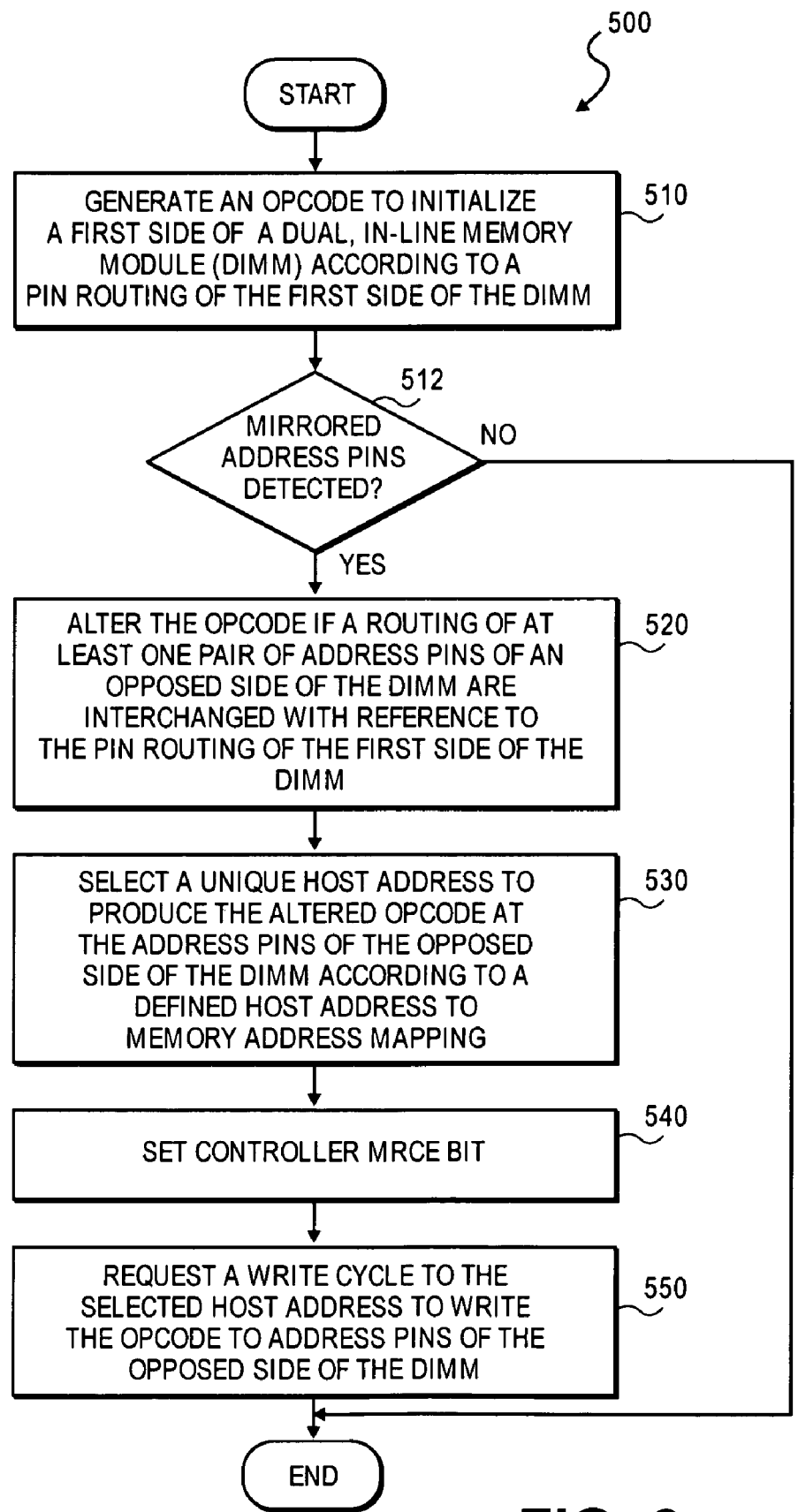
FIG. 6 is a flowchart illustrating a method for initialization of a double-sided memory module having at least one pair of mirrored pins, in accordance with one embodiment.

FIG. 6 is a flowchart illustrating a method 500 for initialization of a double-sided memory module, such as, for example, a dual in-line memory module (DIMM) having at least one pair of mirrored pins, for example, as illustrated with reference to FIGS. 1-5. At process block 510, an opcode is generated to initialize a first side (rank zero) of a double-sided DIMM according to a pin-out of the first side of the DIMM. At process block 520, the opcode is altered if a routing of at least one pair of address pins of an opposed side of the DIMM are interchanged with reference to the first side of the DIMM to form an altered opcode. Such interchange of address pin routing, referred to herein as "memory module mirroring", is illustrated with reference to FIG. 3. Hence, although a similar configuration is selected for each DIMM rank, the altered routing of a DIMM rank to achieve interchange of address signals or memory module mirroring prohibits reuse of the same opcode for each DIMM rank. Hence, the altered opcode is required for the DIMM rank having interchanged routing.

At process block 530, a unique host address is selected to produce the altered opcode at the address pins of the opposed side (rank one) of the DIMM according to a predetermined host address to memory address mapping. Once the unique host address is selected, at process block 540, a controller mode register command enable (MRCE) bit is set to translate write cycles from CPU to memory as mode register commands. At process block 550, a write cycle is requested to the selected host address to produce the altered opcode at the address pins of the opposed side of the DIMM. In one embodiment, system BIOS 200 uses memory mapped I/O to request CPU 102 to issue a write cycle to the selected host address to cause the altered opcode to be written to address pins of rank one of DIMM 300.

FIG. 7 is a flowchart illustrating a method 522 for forming the altered opcode of process block 520 of FIG. 6, in accordance with one embodiment. At process block 524, a pair of re-routed address pins on the opposed side of the DIMM are identified. As described above, such interchange of the physical connectivity of pins at the memory module level, referred to herein as "memory module mirroring," results in interchanged signals on the opposed side of the DIMM, thereby requiring alteration of the opcode to initialize the opposed side of the DIMM. Once detected, at process block 526, a pair of bits within the opcode corresponding to the identified, re-routed address pins are transposed to form the altered opcode. Hence, in one embodiment, initialization of DIMM 300 is performed by writing the opcode to rank zero and writing the altered opcode to rank one of DIMM 300.

FIG. 8 is a flowchart illustrating a method 532 for selecting the host address of process block 530, in accordance with one embodiment. At process block 534, one or more bits of a first side host address selected to produce the opcode at the address pins of the first side of the DIMM are altered to form a host address for the opposed side of the DIMM. Once formed, at process block 536, one or more bits of the selected host address, corresponding to the interchanged address pins, are identified. Once identified, at process block 538, the identified bits are transposed to form the selected unique host address of process block 530. Accordingly, once the selected unique host address is modified according to a host address to memory address mapping by, for example, chipset 150, the selected host address produces the altered opcode, which is written to the address pins of the opposed side (rank zero/rank one) of DIMM 300.

Figure 9:
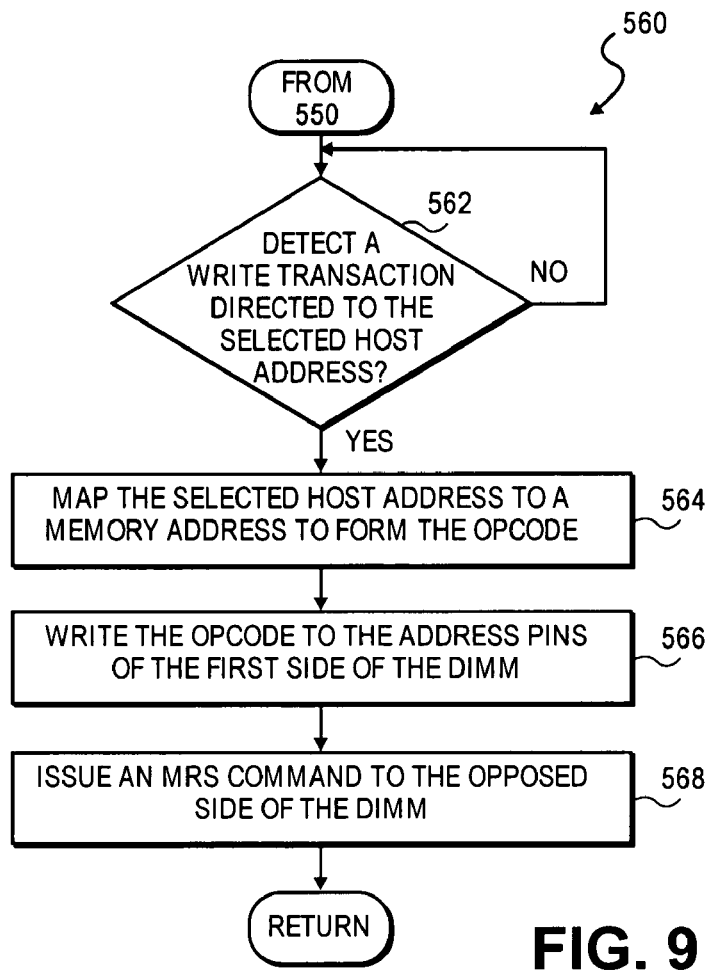
FIG. 9 is a flowchart illustrating a method for requesting a write cycle to a selected host address to initialize a DIMM rank.

FIG. 9 is a flowchart illustrating a method 560 for requesting the write cycle of process block 550, in accordance with one embodiment, for example, as performed by controller 152 of FIG. 2. At process block 562, a write transaction directed to the selected unique host address is detected. In one embodiment, the write transaction is issued by a CPU in response to a transaction request by, for example, system BIOS 200. Once the transaction has issued, the memory controller at process block 564 maps the selected host address to a memory address to form the altered opcode. Once formed, at process block 566, the altered opcode is written to the address pins of the opposed side of the DIMM. Once written, values of the opcode may be used by the opposed side of the DIMM to initialize a mode register of the opposed side of the DIMM.

Figure 10:
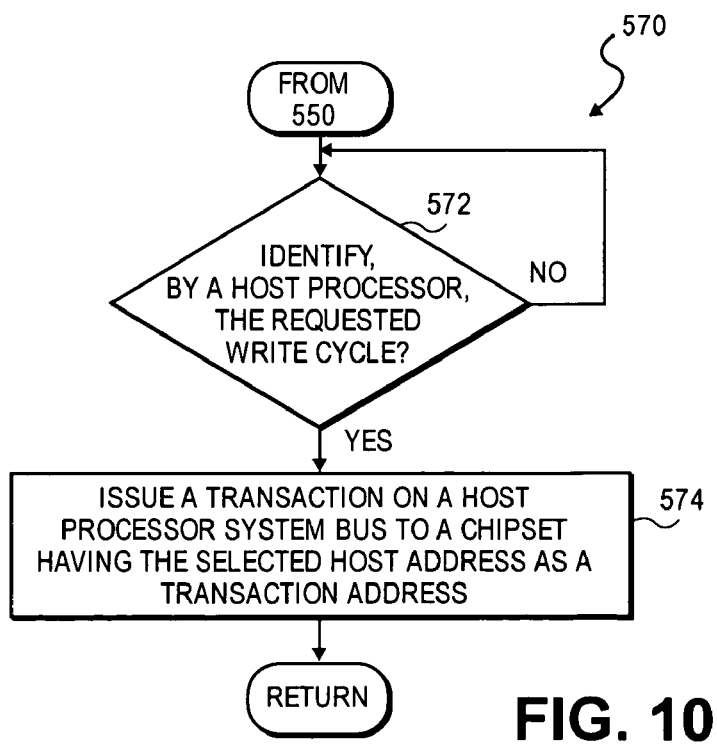
FIG. 10 is a flowchart illustrating a method for requesting a write cycle to cause an opcode to be written to the address pins of a DIMM rank to initialize memory within the DIMM rank, in accordance with one embodiment.

FIG. 10 is a flowchart illustrating a method 570 for requesting the write cycle of process block 550 of FIG. 6. At process block 572, a host processor identifies the requested write cycle. In one embodiment, system BIOS 200 uses programmed I/O transfer to cause an opcode to be written to rank zero or rank one of the DIMM. In one embodiment, system BIOS 200 could issue an interrupt to the CPU to cause a CPU to read write request information within CPU registers. Subsequently, the CPU could issue a write transaction request to chipset 150. Accordingly, at process block 574, a transaction is issued on a host processor system bus to a chipset memory controller having the selected host address as a transaction address. Subsequently, the transaction address is mapped by a memory controller according to a host processor to memory address mapping to form the desired opcode at either rank zero or rank one of DiMM 300.

Figure 11:
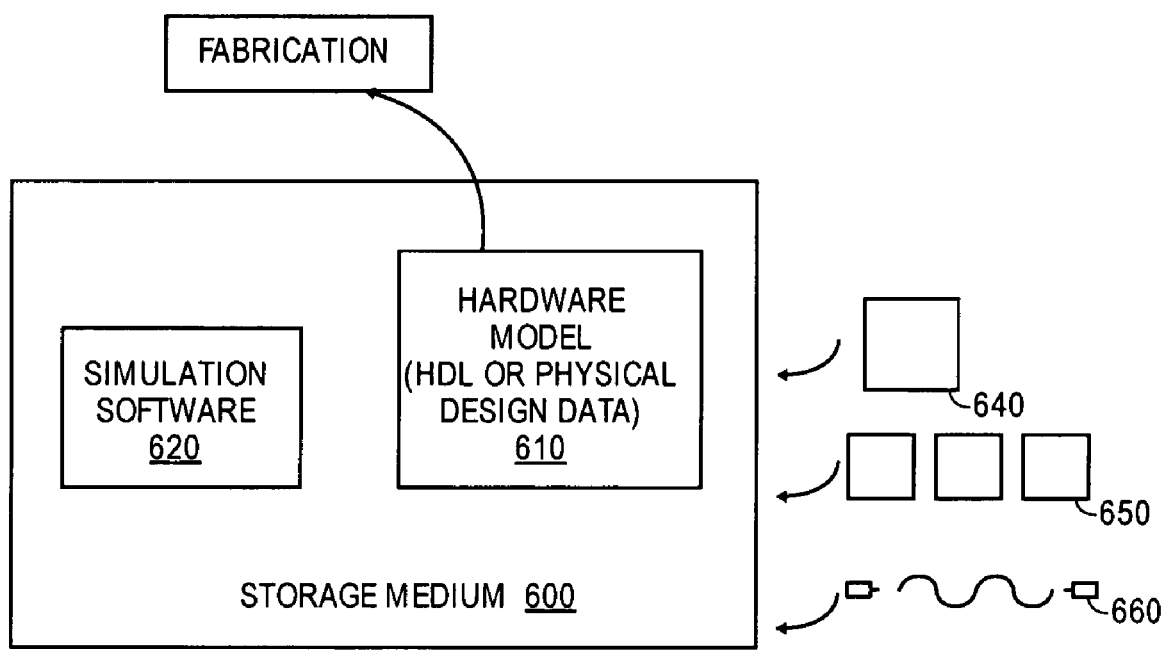
FIG. 11 is a block diagram illustrating various design representations or formats for emulation, simulation and fabrication of a design using the disclosed techniques.

FIG. 11 is a block diagram illustrating various representations or formats for simulation, emulation and fabrication of a design using the disclosed techniques. Data representing a design may represent the design in a number of manners. First, as is useful in simulations, the hardware may be represented using a hardware description language, or another functional description language, which essentially provides a computerized model of how the designed hardware is expected to perform. The hardware model 610 may be stored in a storage medium 600, such as a computer memory, so that the model may be simulated using simulation software 620 that applies a particular test suite 630 to the hardware model to determine if it indeed functions as intended. In some embodiments, the simulation software is not recorded, captured or contained in the medium.

In any representation of the design, the data may be stored in any form of a machine readable medium. An optical or electrical wave 660 modulated or otherwise generated to transport such information, a memory 650 or a magnetic or optical storage 640, such as a disk, may be the machine readable medium. Any of these mediums may carry the design information. The term "carry" (e.g., a machine readable medium carrying information) thus covers information stored on a storage device or information encoded or modulated into or onto a carrier wave. The set of bits describing the design or a particular of the design are (when embodied in a machine readable medium, such as a carrier or storage medium) an article that may be sealed in and out of itself, or used by others for further design or fabrication.

ALTERNATE EMBODIMENTS

It will be appreciated that, for other embodiments, a different system configuration may be used. For example, while the system 100 includes a single CPU 102, for other embodiments, a multiprocessor system (where one or more processors may be similar in configuration and operation to the CPU 102 described above) may benefit from the double-sided DIMM initialization having at least one pair of mirrored pins of various embodiments. Further different type of system or different type of computer system such as, for example, a server, a workstation, a desktop computer system, a gaming system, an embedded computer system, a blade server, etc., may be used for other embodiments.

Having disclosed exemplary embodiments and the best mode, modifications and variations may be made to the disclosed embodiments while remaining within the scope of the embodiments of the invention as defined by the following claims.

What is claimed is:

1. A method comprising:
   generating an opcode to initialize a first side of a double-sided memory module according to a pin routing of the first side of the memory module;
   altering the opcode to form an altered opcode if a routing of at least one pair of address pins of an opposed side of the memory module are interchanged with reference to the pin routing of the first side of the memory module; and
   selecting a unique host address to produce the altered opcode at the address pins of the opposed side of the memory module according to a defined host address to memory address mapping.

2. The method of claim 1, wherein generating the opcode further comprises:
   selecting a unique host address to produce the opcode at the address pins of the first side of the memory module according to a defined host address to memory address mapping; and
   requesting a write cycle to the selected host address to write the opcode to address pins of the first side of the memory module.

3. The method of claim 2, wherein requesting the write cycle further comprises:
   detecting a write transaction directed to the selected host address;
   mapping the selected host address to a memory address to form the opcode; and
   writing the opcode to the address pins of the first side of the memory module.

4. The method of claim 3, wherein requesting the write cycle further comprises:
   identifying, by a host processor, the requested write cycle; and
   issuing a transaction on a host processor system bus to a chipset, the transaction having the selected host address as a transaction address.

5. The method of claim 1, wherein generating the opcode comprises:
   selecting a configuration for the first side of the memory module; and
   forming the opcode to achieve the selected configuration according to a defined determined mapping of first side address pins of the memory module in a mode register of the first side of the memory module.

6. The method of claim 1, wherein altering further comprises:
   identifying the pair of address pins re-routed on the opposed side of the memory module; and
   transposing a pair of bits within the opcode corresponding to the identified re-routed pair of address pins to form the altered opcode.

7. The method of claim 1, wherein selecting the host address further comprises:
   altering one or more bits of a host address selected to produce the opcode at the address pins of the first side of the memory module to form a host address for the opposed side of the memory module;
   identifying one or more bits of the opposed side host address corresponding to the re-routed address pins; and
   transposing the identified bits to form the selected unique host address.

8. The method of claim 1, wherein prior to generating, the method further comprises:
   enabling the memory module to populate a mode register of at least the opposed side of the memory module.

9. The method of claim 1, further comprising:
   detecting, by the memory module, a mode register set command; and
   populating a mode register according to bit values written to address pins of a side of the memory module.

10. The method of claim 1, further comprising:
    disabling the memory module from populating the mode register if each side of the memory module is initialized.

11. A method comprising:
    issuing a mode register set command to enable initialization of a double-sided memory module;
    altering an opcode formed to initialize a first side of the memory module according to a pin routing of the first side of the memory module to form an altered opcode if at least one pair of address pins of an opposed side of the memory module are re-routed with reference to the pin routing of the first side of the memory module; and
    requesting a write cycle to a selected host address to write the altered opcode to address pins of the opposed side of the memory module.

12. The method of claim 11, wherein issuing further comprises:
    generating the opcode to initialize rank zero of the memory module according to the pin-out of rank zero of the memory module;
    selecting a unique host address to produce the opcode at the address pins of the first side of the memory module according to a defined host address to memory address mapping; and
    requesting a write cycle to the selected host address to write the opcode to address pins of the first side of the memory module.

13. The method of claim 11, wherein altering the opcode comprises:
    identifying the pair of address pins re-routed on the opposed side of the memory module;
    transposing a pair of bits within the opcode corresponding to the identified re-routed pair of address pins to form the altered opcode; and
    selecting a unique host address to produce the altered opcode at the address pins of the opposed side of the memory module according to a defined host address to memory address mapping.

14. The method of claim 13, wherein selecting the host address further comprises:
    altering one or more bits of a host address selected to produce the opcode at the address pins of the first side of the memory module to form the selected host address for the opposed side of a memory module; and
    performing a write cycle to the formed host address to write the altered opcode to address pins of the opposed side of the memory module.

15. The method of claim 11, wherein requesting the write cycle further comprises:
    detecting a write transaction directed to the selected host address;
    mapping the selected host address to a memory address to form the opcode; and
    writing the opcode to the address pins of the first side of the memory module.

16. An article of manufacture including a machine recordable medium having stored thereon instructions which may be used to program a system to perform a method, comprising:

issuing a mode register set command to enable initialization of a double-sided memory module;

altering an opcode formed to initialize a first side of the memory module according to a pin routing of the first side of the memory module to form an altered opcode if at least one pair of address pins of an opposed side of the memory module are re-routed with reference to the pin routing of the first side of the memory module; and requesting a write cycle to a selected host address to write the altered opcode to address pins of the opposed side of the memory module.

17. The article of manufacture of claim 16, issuing further comprises:

generating the opcode to initialize rank zero of the memory module according to the pin-out of rank zero of the memory module;

selecting a unique host address to produce the opcode at the address pins of the first side of the memory module according to a predetermined host address to memory address mapping; and requesting a write cycle to the selected host address to write the opcode to address pins of the first side of the memory module.

18. The article of manufacture of claim 16, wherein altering the opcode comprises:

identifying the pair of address pins re-routed on the opposed side of the memory module;

transposing a pair of bits within the opcode corresponding to the identified re-routed pair of address pins to form the altered opcode; and selecting a unique host address to produce the altered opcode at the address pins of the opposed side of the memory module according to a defined host address to memory address mapping.

19. The article of manufacture of claim 18, wherein selecting the host address further comprises:

altering one or more bits of a host address selected to produce the opcode at the address pins of the first side of the memory module to form the selected host address for the opposed side of a memory module; and performing a write cycle to the formed host address to write the altered opcode to address pins of the opposed side of the memory module.

20. The article of manufacture of claim 16, wherein requesting the write cycle further comprises:

detecting a write transaction directed to the selected host address;

mapping the selected host address to a memory address to form the opcode; and writing the opcode to the address pins of the first side of the memory module.

21. A system comprising:

a host processor;

at least one double-sided memory module having a first side and an opposed side;

a chipset coupled between the host processor and the memory module; and a read only memory (ROM) coupled to the chipset, the ROM including a basic input/output system (BIOS) to form an altered opcode to initialize the opposed side of the memory module if a routing of at least one pair of address pins of the opposed side of the memory module are interchanged with reference to a pin routing of the first side of the memory module.

22. The system of claim 21, wherein the system BIOS is further to select a unique host address to produce the altered opcode at the address pins of the opposed side of the memory module according to a defined host address to memory address mapping.

23. The system of claim 21, wherein the chipset further comprises:

a memory controller, the memory controller to detect a write transaction directed to the selected host address, to map the selected host address to a memory address to form the altered opcode, and to write the altered opcode to the address pins of the opposed side of the memory module.

24. The system of claim 21, wherein the chipset further comprises a memory controller.

25. The system of claim 21, wherein the dual, in-line memory module comprises:

a double data rate (DDR) synchronous dynamic random access memory (SDRAM) coupled to a first side of the memory module; and a DDR SDRAM coupled to an opposed side of the memory module.

26. The system of claim 21, wherein the memory module comprises a rank zero mode register and a rank one mode register.

27. The system of claim 21, wherein a command address (CA) bus is coupled to address pin 3 of the first side of the memory module and address pin 3 on the opposed side of the memory module.

28. The system of claim 21, wherein the ROM comprises flash memory.

* * * * *